United States Patent

Peyre-Lavigne et al.

Patent Number: 5,814,876
Date of Patent: Sep. 29, 1998

[54] SEMICONDUCTOR FUSE DEVICES

[75] Inventors: Andre Peyre-Lavigne, Lacroix Falgarde; Jean Michel Reynes, Pomlertuzat; Emmanuel Scheid, Corronsac; Danielle Bielle Daspet, Labege, all of France

[73] Assignee: Motorola, Inc., Schaumburg, Ill.

[21] Appl. No.: 838,472

[22] Filed: Apr. 7, 1997

Related U.S. Application Data

[63] Continuation of Ser. No. 511,569, Aug. 4, 1995, abandoned.

[51] Int. Cl.$^6$ .............................. H01L 27/10; H01L 29/00
[52] U.S. Cl. .......................... 257/529; 257/208; 257/209; 257/528; 438/600; 438/601
[58] Field of Search ..................................... 257/529, 209, 257/208, 528; 437/186; 438/600, 601

[56] References Cited

U.S. PATENT DOCUMENTS

| | | | |
|---|---|---|---|
| 5,021,861 | 6/1991 | Baliga | 257/529 |
| 5,025,300 | 6/1991 | Billig et al. | 257/529 |
| 5,241,212 | 8/1993 | Motonami et al. | 257/529 |
| 5,436,496 | 7/1995 | Jerome et al. | 257/529 |

FOREIGN PATENT DOCUMENTS

| | | | |
|---|---|---|---|
| 54-105988 | 8/1979 | Japan | 257/529 |
| 58-123759 | 7/1983 | Japan | 257/529 |

*Primary Examiner*—Valencia Martin Wallace
*Attorney, Agent, or Firm*—Ziye Zhou

[57] ABSTRACT

A semiconductor fuse device is formed of a conductive semiconductor substrate (11) having a top surface and a bottom surface. A layer (12) of dielectric material is provided on a portion of the top surface and a first conductive layer (15) is formed wholly on a first portion of the layer (12) of dielectric material and forms a first contact of the device. A second conductive layer (14) is formed on a second portion of the layer (12) of dielectric material spaced from the first portion and extends to contact the top surface of the substrate (11). A fuse portion (16) is formed wholly on the layer (12) of dielectric material and extends between and in electrical contact with the first and second conductive layers (14, 15). The bottom surface of the substrate (11) provides a second contact of the device, so that only one wire bond is necessary.

8 Claims, 1 Drawing Sheet

SEMICONDUCTOR FUSE DEVICES

This application is a continuation of prior application Ser. No. 08/511,569, filed Aug. 4, 1995, now abandoned.

FIELD OF THE INVENTION

This invention relates to semiconductor fuse devices.

BACKGROUND OF THE INVENTION

Igniter devices are known in which a semiconductor fuse device is used to ignite explosive material. Generally, such semiconductor fuse devices include a doped silicon fuse portion positioned on a substrate between two contact portions of doped silicon. Wire contacts are then bonded to the two contact portions to connect to control circuitry, which provides the current necessary to blow the fuse at an appropriate time. Such devices are particularly used for igniting explosive material used to blow up air bags or retract seat belts in automobiles for passenger safety.

The wire contacts are time consuming and expensive to form, as well as unreliable. This is particularly so, when explosive material is compacted around the fuse device, which compaction can damage the wire bond.

BRIEF SUMMARY OF THE INVENTION

Accordingly, the invention provides a semiconductor fuse device comprising a conductive semiconductor substrate having a top surface and a bottom surface, a layer of dielectric material on a portion of the top surface, a first conductive layer wholly formed on a first portion of the layer of dielectric material and forming a first contact of the device, a second conductive layer formed on a second portion of the layer of dielectric material spaced from the first portion and extending to contact the top surface of the substrate, a fuse portion formed wholly on said layer of dielectric material and extending between and in electrical contact with the first and second conductive layers, said bottom surface of the substrate providing a second contact of the device.

BRIEF DESCRIPTION OF THE DRAWINGS

One embodiment of the invention will now be more fully described, by way of example, with reference to the drawings, of which.

DETAILED DESCRIPTION

Figure 1:
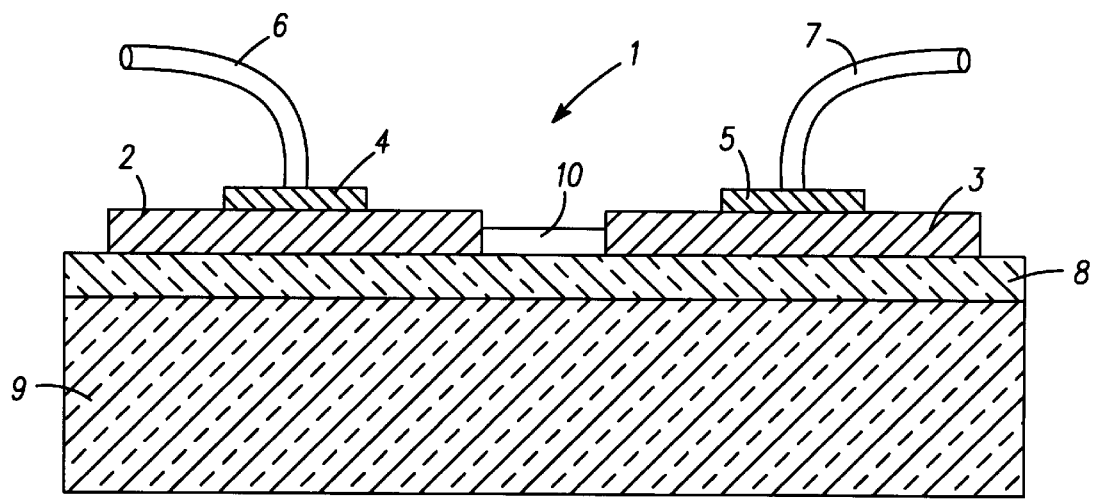
FIG. 1 shows a known prior art device.

Thus, as shown in FIG. 1, a known semiconductor igniter device 1 has two contacts 2 and 3 made of an electrically conductive material, for example polycrystalline silicon doped with aluminium, on which are provided wire bonds 4 and 5 connecting wires 6 and 7 to the contacts 2 and 3, respectively. Clearly, the bonds 4 and 5 are also of electrically conductive material, for example solder.

The contacts 2 and 3 are provided on an insulating layer 8 of silicon dioxide, which is formed on a silicon substrate 9. The contacts are arranged to be spaced from the edge of the insulating layer 8 and from each other. Also on the insulating layer 8 is provided an igniter fuse 10 extending between the two contacts 2 and 3 and formed of polycrystalline silicon doped with phosphorus to have a resistivity of $10^{-3}$ ohm.cm.

As is well known, when an appropriate voltage is provided between the two wires 6 and 7 the potential; difference across the fuse 10 causes current to flow through the fuse, which vapourises and ignites pyrotechnic material which is compacted around it (not shown). The pyrotechnic material then ignites suitable gas-generating material which blows up an automotive airbag or seatbelt retractor.

As mentioned above, this structure can be unreliable since compaction of the pyrotechnic material around the wire bonds can damage them, the wire bonds themselves are relatively complicated to produce and can be inaccurately manufactured.

Figure 2:
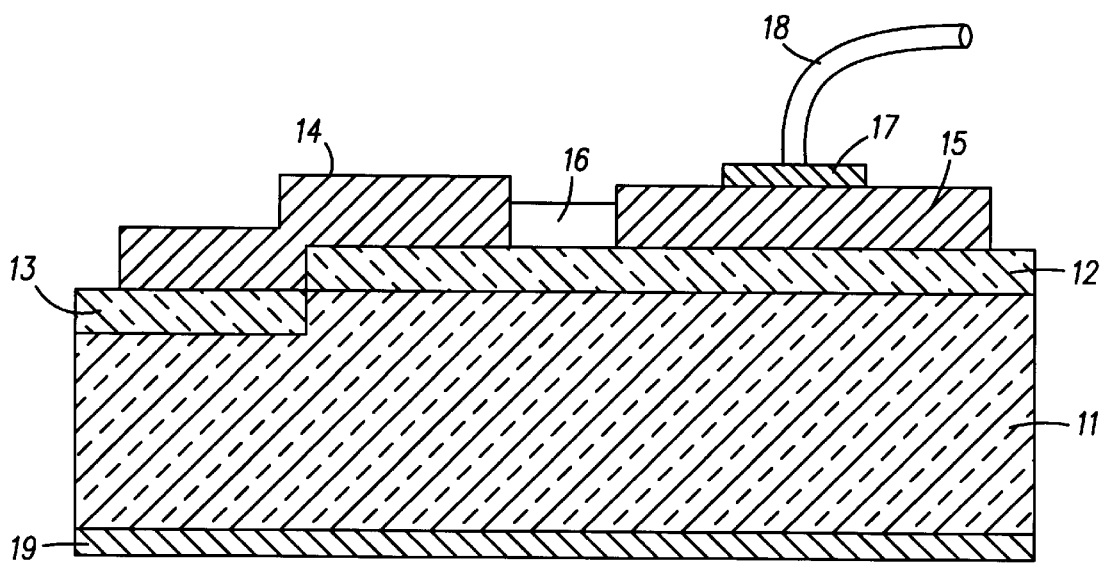
FIG. 2 shows a device according to the invention.

According to one embodiment of the present invention, as shown in FIG. 2, a semiconductor fuse device includes a silicon substrate 11, which has been doped with arsenic to $2 \times 10^{19}$ atoms per cubic centimeter (at/cm$^3$) to make it electrically conductive. An insulating layer 12 of silicon dioxide is then formed over most, but not all, of the top surface of the substrate 11. A top region 13 of the substrate 11 which has not been covered by the insulating layer 12 is then further doped with Phosphorus to a level of $2 \times 10^{20}$ at/cm$^3$ to increase the conductivity of the top surface of the substrate 11 adjacent the insulating layer 12.

A pair of contacts 14 and 15 are then deposited on the device such that one contact 14 overlies the region 13 of the substrate 11 and extends over the edge of the insulating layer 12 to overly part of the insulating layer 12. The second contact 15 is deposited such that it is wholly on the insulating layer 12 and spaced from both the edge of the insulating layer 12 and the first contact 14. Between the contacts 14 and 15 is provided a fuse 16 formed of polycrystalline silicon doped with phosphorus, similar to the known fuse described above.

A wire bond 17 is provided to bond a wire 18 to the second contact 15. The bottom surface of the substrate 11 is provided with a metal layer 19 of Gold or Titanium Nickel Gold or any other suitable electrically conductive material. The base of the device formed by metal layer 19 essentially forms one contact for the device, thus replacing the need for two wire bonds. In this embodiment, the voltage is provided between the wire 18 and the metal layer 19, which, since the substrate 11 is conductive, produces a potential difference across the contacts 14 and 15 and therefore causes the fuse 16 to vaporize.

The region 13 is provided with increased conductivity in order to minimize the resistivity across the junction between the contact 14 and the region 13 of substrate 11.

Since there is only one wire bond, the problems associated with wire bonds, as discussed above, are halved. The device itself can easily be manufactured using known semiconductor fabrication processes, and can, of course, be utilised in any applications requiring a fuse, not just in those applications where the fuse is used as an igniter. For example, the device can be used in applications where so-called "intelligent" fuses are required. Of course, it will be appreciated that if the device is used as an igniter, then the fuse must be such that it vaporizes in a manner suitable to ignite the pyrotechnic material (not shown) which is compacted around it, whereas if the fuse is not used as an igniter, then it only needs to be of a material which will break the electrical conductivity, but not necessarily in a manner suitable to ignite pyrotechnic material.

It will further be appreciated that although only one particular embodiment of the invention has been described in detail, various modifications and improvements can be made by a person skilled in the art without departing from the scope of the present invention. For example, the structure of the device could be fabricated using various different processes.

We claim:

1. A semiconductor igniter device for igniting a pyrotechnic material, comprising:

a conductive semiconductor substrate having a top surface and a bottom surface;

a layer of dielectric material on a first portion of the top surface of said substrate;

a first conductive layer wholly formed on a first portion of said layer of dielectric material and forming a first contact of said semiconductor igniter device;

a second conductive layer formed directly on a second portion of the top surface of said substrate and extending over a second portion of said layer of dielectric material, said second conductive layer being spaced from said first conductive layer;

a third conductive layer provided on the bottom surface of said substrate, said third conductive layer forming a second contact of said semiconductor igniter device, wherein a conductive path through said substrate is provided between said second conductive layer and said third conductive layer; and a fuse portion formed wholly on said layer of dielectric material and extending between and in electrical contact with said first and second conductive layers, said fuse portion igniting the pyrotechnic material when a current flows between the first and second contacts of said semiconductor igniter device.

2. The semiconductor igniter device of claim 1, further comprising a highly conductive region provided in said substrate adjacent the second portion of the top surface and in electrical contact with said second conductive layer, said highly conductive region having a higher conductivity than rest of said substrate.

3. The semiconductor igniter device of claim 1, wherein said substrate is Arsenic doped silicon.

4. The semiconductor igniter device of claim 3, wherein the level of arsenic doping is $2\times10^{19}$ at/cm$^3$.

5. The semiconductor igniter device of claim 1, wherein said substrate is Phosphorus doped silicon.

6. The semiconductor igniter device of claim 2, wherein said highly conductive region is Phosphorus doped silicon.

7. The semiconductor igniter device of claim 5, wherein the level of Phosphorus doping is $2\times10^{20}$ at/cm$^3$.

8. The semiconductor igniter device of claim 5, wherein said fuse is phosphorus doped polycrystalline silicon.

* * * * *